(12) United States Patent
Tsuda

(10) Patent No.: US 6,504,373 B2
(45) Date of Patent: Jan. 7, 2003

(54) MAGNETIC RESONANCE IMAGING APPARATUS

(75) Inventor: Munetaka Tsuda, Mito (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/778,995

(22) Filed: Feb. 7, 2001

(65) Prior Publication Data

US 2001/0013778 A1 Aug. 16, 2001

(30) Foreign Application Priority Data

Feb. 10, 2000 (JP) ........................................ 2000-034027

(51) Int. Cl.$^7$ ................................................. G01V 3/00
(52) U.S. Cl. ......................................... 324/322; 324/318
(58) Field of Search ................................. 324/300, 306, 324/307, 309, 314, 318, 322

(56) References Cited

U.S. PATENT DOCUMENTS

| | | | |
|---|---|---|---|
| 5,363,077 A | | 11/1994 | Herd et al. .................. 335/216 |
| 5,548,653 A | * | 8/1996 | Pla et al. .................. 381/71.11 |
| 5,952,734 A | | 9/1999 | Gelbien ....................... 307/91 |
| 6,169,404 B1 | * | 1/2001 | Eckels ........................ 324/318 |
| 6,188,220 B1 | * | 2/2001 | Schaefer ..................... 324/309 |

FOREIGN PATENT DOCUMENTS

| | | |
|---|---|---|
| JP | 10179546 | 7/1998 |
| JP | 11155831 | 6/1999 |
| JP | 11197132 | 7/1999 |

* cited by examiner

Primary Examiner—Louis Arana
(74) Attorney, Agent, or Firm—Cooper & Dunham LLP

(57) ABSTRACT

Operation signals of a compressor 21 for a helium refrigerator 20 are inputted to a correction magnetic field power source 13, so as to generate a current in synchronism with mechanical vibration of the helium refrigerator 20. The current generated by the correction magnetic field power source 13 drives a magnetic field correction coil 14 combined with the static magnetic field generation magnet 2 so as to generate a correction magnetic field of which amplitude is equal to that of the magnetic field variation component caused by the mechanical vibration of the helium refrigerator 20 and of which phase is inverted thereto. Thereby, an open type MRI apparatus employing a super conducting magnet, which eliminates a magnetic field variation due to mechanical vibration of the helium refrigerator 20 and always maintains a stable magnetic field, is realized.

18 Claims, 6 Drawing Sheets

Mesured Matrix Data

81   Phase Diagram

MAGNETIC RESONANCE IMAGING APPARATUS

BACKGROUND OF THE INVENTION

1. Field of the Invention

The present invention relates to a magnetic resonance imaging (hereinbelow will be referred to as MRI) apparatus, and more specifically relates to an MRI apparatus which employs an open type super conducting magnet not giving a feeling of pressure to a patient and improves magnetic field stability in a space to be used for inspection.

2. Conventional Art

An MRI, which obtains a tomographic picture image of a human body by making use of nuclear magnetic resonance (hereinbelow will be referred to as NMR) phenomenon, has been broadly utilized in medical facilities. In order to obtain a tomographic picture image correctly reflecting an inner structure of an inspection portion of a body to be inspected, the MRI necessitates a magnet which generates a uniform magnetic field intensity in a space covering the inspection portion. Since a space having a uniform magnetic field can be obtained in a solenoid coil having infinite length, many magnets used in the MRI devices are structured to have a long and narrow cylindrical solenoid coil and a shim structure assembled therein which improves magnetic field uniformity.

Since a magnet structure which requires to position a person to be inspected in a long and narrow space gives a feeling of pressure to the person to be inspected, an MRI apparatus using such magnet is not proper for inspecting such as claustrophobes and children. For this reason, such MRI apparatuses have been developed and become widespread in these days that use a magnet generating a comparatively low magnetic field and structure the magnet such as to provide an opening portion at the side face of the magnet or to broaden a carry-in portion of the person to be inspected at the front face of the magnet.

In order to enhance magnetic field intensity generated by open type magnets, magnets using such as conventional permanent magnets and normal conducting coils as well as assembling super conducting coils have been developed. JP-A-10-179546(1998), JP-A-11-155831(1999) and JP-A-11-197132(1999), for example, show such development. An open type magnet assembling the above referred to super conducting coils can achieve magnetic field intensity generated thereby of 1.0 Tesla, which is five times larger than that generated by a magnet using the conventional permanent magnet and normal conducting coils. Resultantly, with such open type magnet five times larger NMR signal intensity which is substantially comparable with the magnetic field intensity ratio can be obtained, thereby, a sufficient picture quality in case of real time measurement can be ensured.

However, when configuring a cryostat in which super conducting coils are disposed into an open type structure, it is noted that there arises a problem that the cryostat tends to suffer vibration. Namely, in an open type super conducting magnet the cryostat is divided into two parts in each of which a super conducting coil is accommodated in a sealed manner and the divided two parts of the cryostat are arranged to form a space for receiving the person to be inspected therebetween, therefore, differences with regard to vibration for the respective two part divided cryostats are generated and the differences in vibration cause to vary the magnetic field generated by the respective super conducting coils accommodated in the respective two part divided cryostats.

Causes of vibration of the two part divided cryostats are, for example, vibration from a building where the magnet is installed and vibrations of devices themselves such as a gradient magnetic field generating means and a helium refrigerator which are driven in a pulsating manner, for example, with regard to the helium refrigerator helium moves from a compressor to the refrigerator or to the compressor from the refrigerator with a predetermined operating period, therefore, vibration having a predetermined period corresponding to the above operating period is generated. Such periodic vibration causes a pseudo image in a picture image which affects significantly to the picture quality thereof.

Namely, when one of the two part divided cryostats is vibrated with a regular interval ($1/\omega$), measured NMR signals are modulated with oscillation frequency $\omega$. When the modulated signals are processed to convert into such as picture images and spectrums, pseudo images other than a true picture image may appear at respective positions shifted by every $\omega$ as well as pseudo peaks may appear at both sides of true spectrums as sideband waves. Even when the magnetic field variation is microscopic, because of its regular variation the pseudo images and the pseudo peaks appear clearly.

Such a periodic vibration is caused when a helium refrigerator is attached on the cryostat. In order to prevent such vibration, it is tried to introduce a mechanically flexible structural member (bellows) so as not to transfer vibration of the helium refrigerator into the cryostat as disclosed in U.S. Pat. No. 5,363,077.

Further, as disclosed in U.S. Pat. No. 5,952,734, an MRI apparatus, in which a sensor for detecting error magnetic field and a feed back loop control for nulling error components in the sensor signals are incorporated, is proposed.

Although the displacement vibration due to the mechanical vibration of the helium refrigerator can be removed significantly by the flexible structural member (bellows), no effect can be obtained with respect to the displacement due to inertia force. Further, signals due to a pulse operated gradient magnetic field and a high frequency magnetic field which are used for the inspection inherent to the MRI are induced in the magnetic field sensor, it is difficult to detect the microscopic magnetic field (of about 0.05 ppm) due to the mechanical vibration of the helium refrigerator with the magnetic field sensor.

SUMMARY OF THE INVENTION

The present invention is completed in view of the above problems, and an object of the present invention is to provide an MRI apparatus which prevents the magnetic field variation due to vibration, in particular, due to vibration caused in an open type high magnetic field MRI apparatus and enhances a reliability of the detection result obtained thereby.

An MRI apparatus according to the present invention which achieves the above object comprises a static magnetic field generating means for generating magnetic field of a predetermined intensity; a gradient magnetic field generating means for generating magnetic field having an intensity gradient; means for generating a high frequency magnetic field; means for detecting nuclear magnetic resonance signals generated from a body to be inspected; and means for processing the nuclear magnetic resonance signals and for displaying the processed result, wherein further comprises a magnetic field correction means for correcting magnetic field variation due to vibration of the static magnetic field generating means, and the magnetic field correction means includes means for generating a correction magnetic field having a frequency corresponding to the frequency of the vibration.

Through the generation of the correction magnetic field having a frequency corresponding to the frequency of the vibration, the magnetic field vibration caused by a periodic vibration is effectively canceled out without detecting the magnetic field variation itself. Thereby, the generation of such as the pseudo images and the pseudo peaks in tomographic picture images due to the vibration is eliminated.

More specifically, in the present invention, the magnetic field correction means is provided with a magnetic field generation coil for generating a correction magnetic field and a power source for driving the magnetic field generation coil, and the power source is inputted of operating signals from a vibration generation source and drives the magnetic field generation coil based on the inputted operating signals.

Further, in one preferred embodiment of an MRI apparatus according to the present invention, the static magnetic field generation means includes a super conducting coil for generating a static magnetic field and a cryostat with a refrigerator into which the super conducting coil is accommodated, and the correction magnetic field generation means corrects the magnetic field variation caused by the vibration generated by the refrigerator.

With the MRI apparatus according to the preferred embodiment, the operating signals for driving the refrigerator are directly taken out from the drive source for the refrigerator and are provided to the correction magnetic field generation means, thereby, a correction magnetic field having a frequency corresponding to the frequency of the vibration is generated and thus, the magnetic field variation caused by the vibration generated by the refrigerator can be canceled out.

The MRI apparatus according to the present invention is particularly applicable to one having such a static magnetic field generation means which is structured to arrange at least a pair of super conducting coils so as to sandwich a space for laying a person to be inspected.

DESCRIPTION OF THE PREFERRED EMBODIMENTS

Hereinbelow, preferred embodiments according to the present invention will be explained with reference to the drawings.

Figure 1:
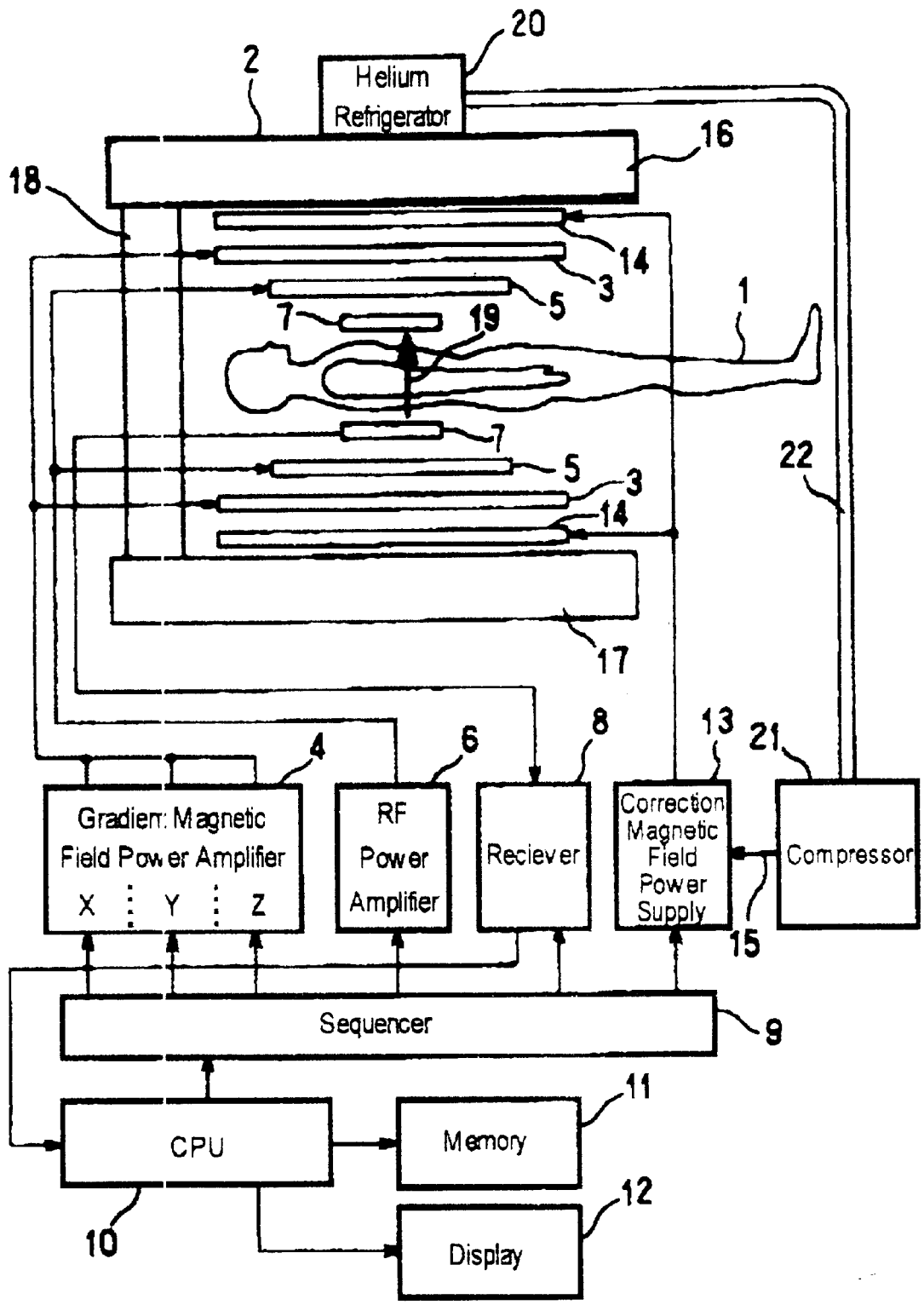
FIG. 1 is schematic diagram showing an entire structure of an MRI apparatus representing an embodiment according to the present invention.

FIG. 1 is a schematic diagram of entire structure of an MRI apparatus to which the present invention is applied. The MRI apparatus is provided with a static magnetic field generation magnet 2 which is disposed so as to sandwich a space where a body 1 to be inspected is positioned, a pair of gradient magnetic field coils disposed respectively inside the static magnetic field generation magnet 2, a pair of high frequency coils 5 disposed respectively further inside the pair of gradient magnetic field coils 3 and a pair of detection coils which detect NMR signals generated from the body 1 to be inspected. The MRI apparatus 1 comprises a CPU 10 which controls a sequencer 9 which controls operation timings of the respective coils and a memory device 11 as well as processes the NMR signals to form picture images and spectrums for a display 12.

In the illustrated embodiment, the static magnetic field generation magnet 2 is constituted by an upper cryostat 16 and a lower cryostat 17 each accommodating a super conducting coil and a cryostat coupling duct 18 coupling the upper cryostat 16 and the lower cryostat 17, and is designed to generate a uniform static magnetic field in a space surrounding the body 1 to be inspected in a direction perpendicular to the body axis. The direction of magnetic fluxes of the magnetic field is directed from a floor to a ceiling as shown by an arrow 19, and the uniformity of the magnetic field is regulated, for example, below about 5 ppm in a spherical space in which the body 1 to be inspected is positioned. For the regulation of the magnetic field uniformity in the present embodiment, a passive shimming is applied in which a plurality of small pieces of magnetic bodies (not shown) are adhered on the surfaces of the upper cryostat 16 and of the lower cryostat 17. As an alternative an active shimming can be used in which proper currents are supplied to magnetic field correction coils to eliminate a non-uniformity.

Further, in order to reduce amount of evaporation of liquid helium a helium refrigerator 20 is assembled to the upper cryostat 16. The helium refrigerator 20 is connected to a compressor 21 which supplies helium gas via a high pressure pipe 22.

The gradient magnetic field coil 3 is constituted by three sets of gradient magnetic coils respectively wound so that magnetic flux density can be varied in three axial directions x, y and z crossing perpendicularly each other and respectively connected to a gradient magnetic field power source 4, and in combination therewith constitutes a gradient magnetic field generation means. Through the drive of the gradient magnetic field power source 4 according to control signals from the sequencer 9 currents flowing through the three sets of the gradient magnetic coils 3 are varied, thereby, gradient magnetic fields Gx, Gy and Gz in three axial direction are applied to the body 1 to be inspected. The gradient magnetic fields are used to determine a spatial distribution of NMR signals obtained from an inspection portion of the body 1 to be inspected.

The high frequency coil 5 is connected to a high frequency power amplifier 6 for flowing a high frequency current thereto, and generates a high frequency magnetic field which excites in resonance atomic nucleus (usually hydrogen nucleus is used) in the inspection portion of the body 1 to be inspected. The high frequency power amplifier 6 is also controlled by control signals from the sequencer 9.

The detection coil 7 is connected to a receiver 8 and constitutes means for detecting NMR signals generated from the body 1 to be inspected. The receiver 8 amplifies and detects the NMR signals detected by the detection coil 7 as well as converts into digital signals which permit processing in the CPU 10. The receiver 8 is also controlled by the sequencer 9 with regard to its operation time.

The CPU 10 performs operations such as reconstruction of picture images and spectrum calculation by making use of the digital converted NMR signals as well as controls operations of the respective units in the MRI apparatus at predetermined timings via the sequencer 9. An operation processing system is constituted by the CPU, the memory device 11 which stores data and the display device which displays data after being processed.

In addition to the above elements, the MRI apparatus according to the present embodiment is provided with a magnetic field correction system which maintains the intensity of magnetic field generated by the static magnetic field generation magnetic 2. The magnetic field correction system is constituted by a magnetic field correction power source 13 which outputs a correction current corresponding to a change of the magnetic field intensity (a variation of the magnetic field intensity) and a pair of correction magnetic field coils 14 which receives the outputted correction current and generates a correction magnetic field (an additional magnetic field). The present embodiment, is constituted so as to correct a magnetic field variation, in that a periodic magnetic field variation in association with vibration of the helium refrigerator 20 assembled on the upper cryostat 16. Therefore, the correction magnetic field power source 13 is connected via a signal cable 15 to a compressor 21 which supplies liquid helium to the helium refrigerator 20 and drives the same. Thereby, operation signals from the compressor 21 are taken out and utilized to drive the correction magnetic field coils 14. Further, the correction magnetic field power source 13 is connected to the CPU 10 via the sequencer 9 and thus the operation thereof is controlled by the CPU 10. The CPU 10 controls the drive start and end of the correction magnetic field power source 13 in synchronism with the inspection start and end so as to generate the correction magnetic field.

Figure 2:
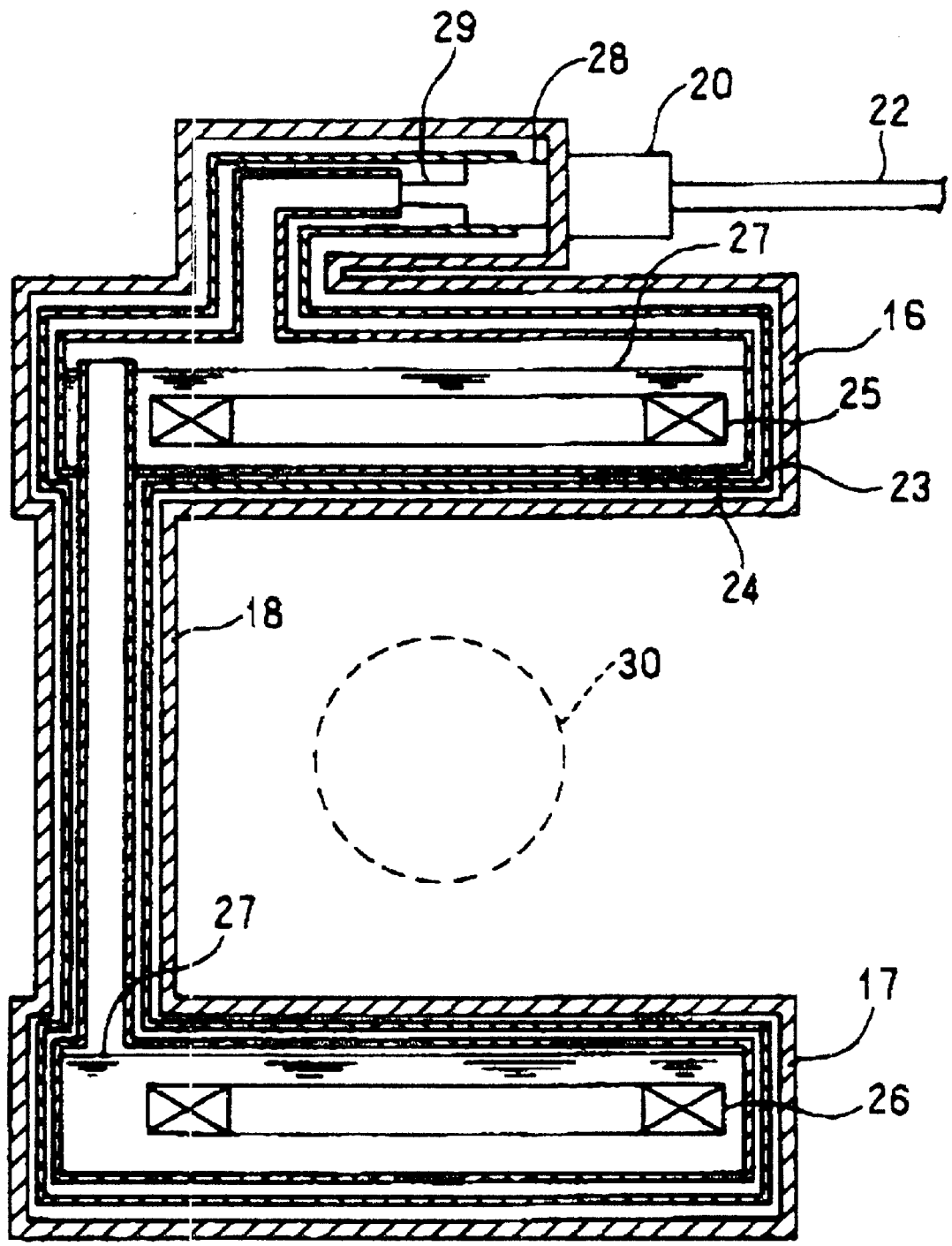
FIG. 2 is an inner structural diagram of a static magnetic field generation magnet in FIG. 1.

FIG. 2 shows an inner structure of the static magnetic field generation magnet 2 as used in FIG. 1 embodiment. The upper cryostat 16 and the lower cryostat 17 are connected via the cryostat coupling duct 18. Inside the upper cryostat 16, the lower cryostat 17 and the cryostat coupling duct 18 a heat shield casing 23 constituted by a continuous aluminum plate and a helium vessel 24 likely constituted by a continuous aluminum plate are assembled. In the helium vessel 24 an upper super conducting coil 25 and a lower super conducting coil 26 are respectively disposed. In the drawing only a pair of the super conducting coils 26 and 27 are illustrated, however, a plurality pair of super conducting coils can be disposed so as to enhance uniformity of the magnetic field intensity. The helium vessel 24 is filled with liquid helium of a temperature of 4.2° k so as to maintain the super conducting condition of the upper super conducting coil 25 and the lower super conducting coil 26.

The helium refrigerator 20 is attached on the upper cryostat 16. The helium refrigerator 20 is constituted in multi stages. In the illustrated example, the helium refrigerator 20 is constituted by a first stage 28 and a second stage 29, and the first stage 28 is thermally contacted to the heat shield casing 23 and the second stage 29 to the helium vessel 24. On the other hand, the helium refrigerator 20 repeats such an operation, for example, in a cycle of one sec that the helium refrigerator 20 is supplied from the compressor 21 compressed helium gas via the high pressure pipe 22 and returns the same to the compressor 21 after adiabatic expansion. Thereby, the first stage 28 of the helium refrigerator 20 and the heat shield casing 23 are cooled to a temperature of 50° k and the second stage 29 thereof and the helium vessel 24 to a temperature of 4.2° k. As a result, an amount of evaporation of liquid helium 27 in the helium vessel 24 can be maintained substantially zero.

Figure 3:
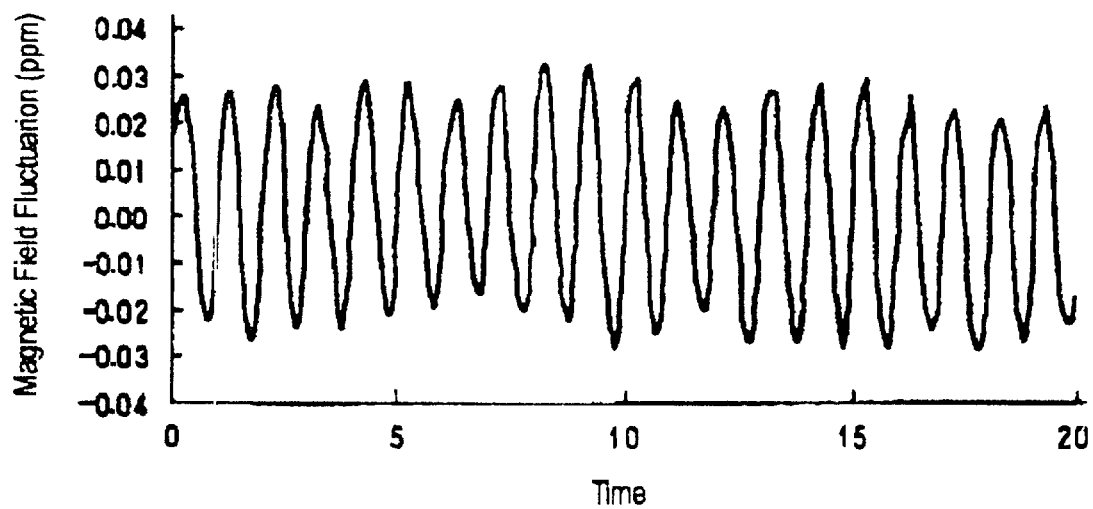
FIG. 3 is a diagram showing variation of magnetic field intensity with respect to time before correction.

Through the movement of the highly compressed helium gas the pressure in the helium refrigerator 20 varies in response to the operation cycle of the compressor 21, namely the cycle of one sec, thereby, mechanical vibration is caused at thermal contact portions between the first stage 28 and the thermal shield casing 23 and between the second stage 29 and the helium vessel 24. With this mechanical vibration the magnetic field generated in a space 30 where the person 1 to be inspected is positioned varies regularly in a cycle of one sec as illustrated in FIG. 3.

The magnetic field correction system generates a magnetic field which cancels out the above referred to varying magnetic field, namely a magnetic field of which amplitude is the same and of which phase is inverted. For this purpose, the correction magnetic field power source 13 takes in the operation signals of the compressor 21 which are the cause of generating the mechanical vibration, and drives the correction magnetic field coils 14 by making use of the taken-in operation signals.

Figure 4:
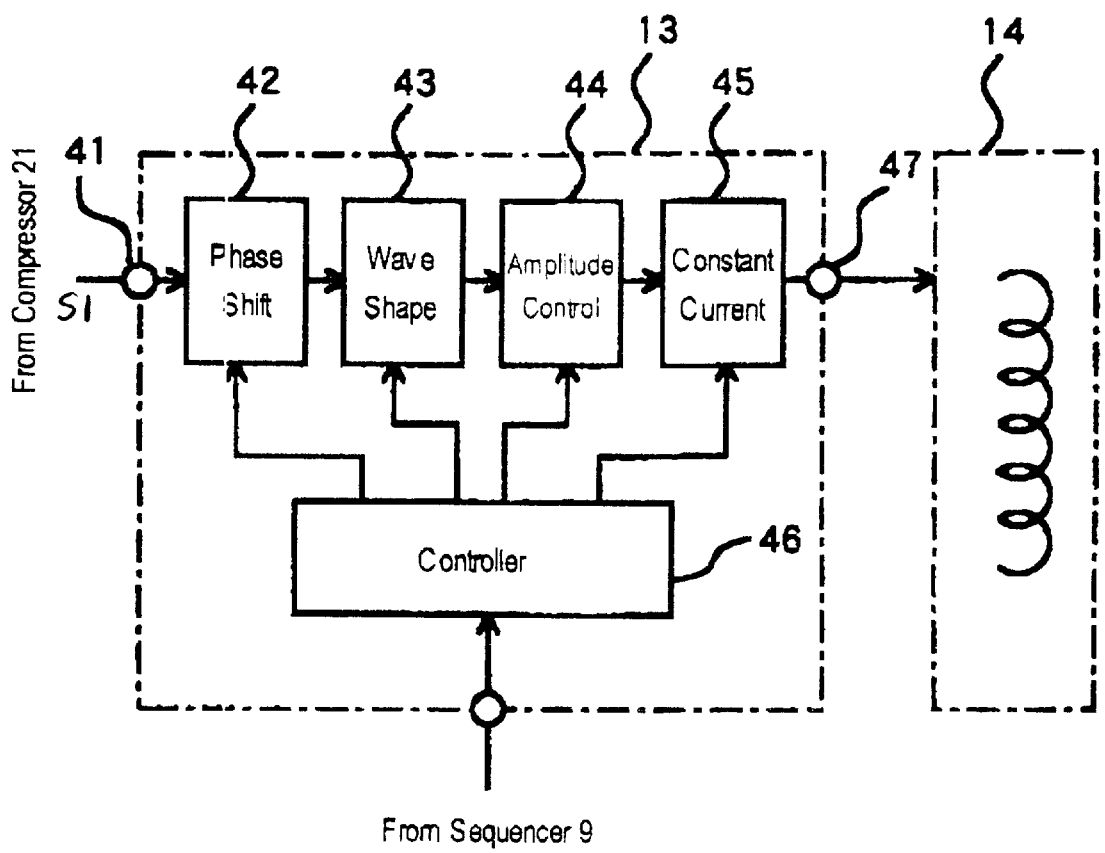
FIG. 4 is a block diagram of a magnetic field correction power source circuit introduced in an MRI apparatus according to the present invention.

FIG. 4 shows an example of the correction magnetic field power source circuit 13. As illustrated in the drawing the correction magnetic field power source circuit 13 is provided with a terminal 41 to which operation signals S1 from the compressor 21 are inputted, a phase shift circuit 42 which shifts the phase of the inputted operation signals S1, a waveform shaping circuit 43 which shapes the rectangular wave shape of the operation signals S1 into a sinusoidal wave shape, an amplitude control circuit 44 which adjusts the amplitude of the signals from the waveform shaping circuit 43 into a proper amplitude, a constant current circuit 45 which generates a constant current corresponding to the signal level from the amplitude control circuit 44 and a control circuit 46 which is inputted from the sequencer 9 of control signals and controls the above respective circuits according to the inputted control signals. The current generated from the constant current circuit 45 is supplied to the correction magnetic field coils 14 via an output terminal 47.

The phase shift circuit 42 shifts the phase of the operation signals S1 by 180° and generates signals having inverted phase with respect to those of the signal S1 from the compressor 21. The amplitude control circuit 44 adjusts the amplitude of the signals so that the correction magnetic field coils 14 generate a magnetic field having the same magnitude as that of the magnetic field variation caused by the mechanical vibration. The adjustment of the amplitude can be realized, for example, in advance in such a manner that while measuring picture images by making use of a uniform substance (a phantom) for adjustment use, and the amplitude control circuit 44 is adjusted so that pseudo images in the measured picture images are minimized by a visual judgement. Usually, the mechanical vibration of the helium refrigerator 20 does not vary depending on every person to be inspected, therefore, the above referred to adjustment can be performed beforehand at the initial setting of the apparatus, which is convenient for a user.

A further accurate amplitude adjustment which is performed for every inspection can be employed which will be explained later.

The control circuit 46 sends out the control signals to the respective circuits and controls the correction magnetic field power source 13 so as to operate the same during the inspection. Further, the phase shift circuit 42, the waveform shaping circuit 43 and the amplitude control circuit 44 permit to be adjusted while judging error components contained such as in the picture images and the spectrum signals obtained in connection with actual inspection. In this instance, in addition to the control according to the operation control signals the control circuit 46 can be provided with a control function necessary for performing these automatic adjustment.

In case of the MRI apparatus as illustrated in FIG. 1 wherein the pair of super conducting coils 25 and 26 are arranged in vertical direction, since the magnetic field variation as illustrated in FIG. 3 is directed in the direction of the static magnetic field (z direction), coils which generate a linear magnetic field in z direction are used for the correction magnetic field coils 14.

In FIG. 1 embodiment the pair of correction magnetic field coils 14 corresponding to the pair of upper and lower cryostats 16 and 17 are disposed, however, one correction magnetic field coil can be provided either of the pair of upper and lower cryostats, for example, only on the upper cryostat 16.

Now, an operation of the thus constituted correction magnetic field power source 13 will be explained. At first, when an inspection is started, the control circuit 46 is operated by signals from the sequencer 9 to start the correction magnetic field power source 13. Thereby, the correction magnetic field power source 13 is inputted of operation signals S1 from the compressor 21 in synchronism with the operation thereof, and after the phase of the input signals is inverted by the phase shift circuit 42, the waveform of the phase inverted signals is waveshaped into a sinusoidal wave. After converting the amplitude of the sinusoidal waveform signal into a predetermined amplitude, the signal is further converted into a constant current and which is supplied to the pair of the correction magnetic field coils 14 via the output terminal 47. Thereby, the correction magnetic field coils 14 generate a magnetic field of which intensity is periodically inverted. The frequency of the magnetic field variation caused by the correction magnetic field coils 14 is equal to the frequency of the operation signals S1 of the compressor 21, although the phase thereof is inverted.

Figure 5:
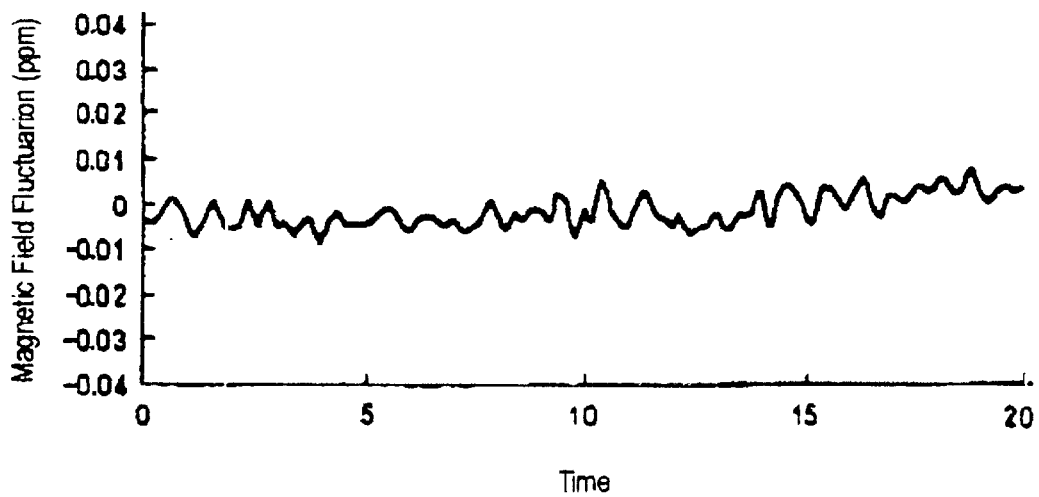
FIG. 5 is a diagram showing variation of magnetic field intensity with respect to time after correction with the magnetic field power source circuit as shown in FIG. 4.

Further, the maximum magnetic field intensity of the correction magnetic field coils 14 is adjusted so as to give the same amplitude of the varying magnetic field as shown in FIG. 3. Namely, the correction magnetic field coils 14 generate a correction magnetic field which can cancel out the varying magnetic field as shown in FIG. 3. As a result, the effect due to the mechanical vibration of the helium refrigerator 20 is removed from the variation components in the magnetic field generated by the static magnetic field generation magnet 2 as shown in FIG. 5.

The generation of such correction magnetic field is continued during an inspection is effected, and when the inspection is completed, the correction magnetic field generation power source 13 is deactivated based on a control signal from the sequencer 9. The magnetic field variation components due to vibration of the static magnetic field generation power source 2 (in other words the cryostat 16) contained in the MR picture images thus obtained are corrected, picture images of an improved picture quality without such as pseudo images and pseudo peaks in association with the mechanical vibration can be obtained.

Now, another method of adjusting amplitude of the correction magnetic field by the correction magnetic field generation power source 13 will be explained with reference to FIG. 6. In this method, the amplitude adjusting circuit 44 automatically sets a proper amplitude of a magnetic field which cancels out the varying magnetic field for every inspection.

Figure 6:
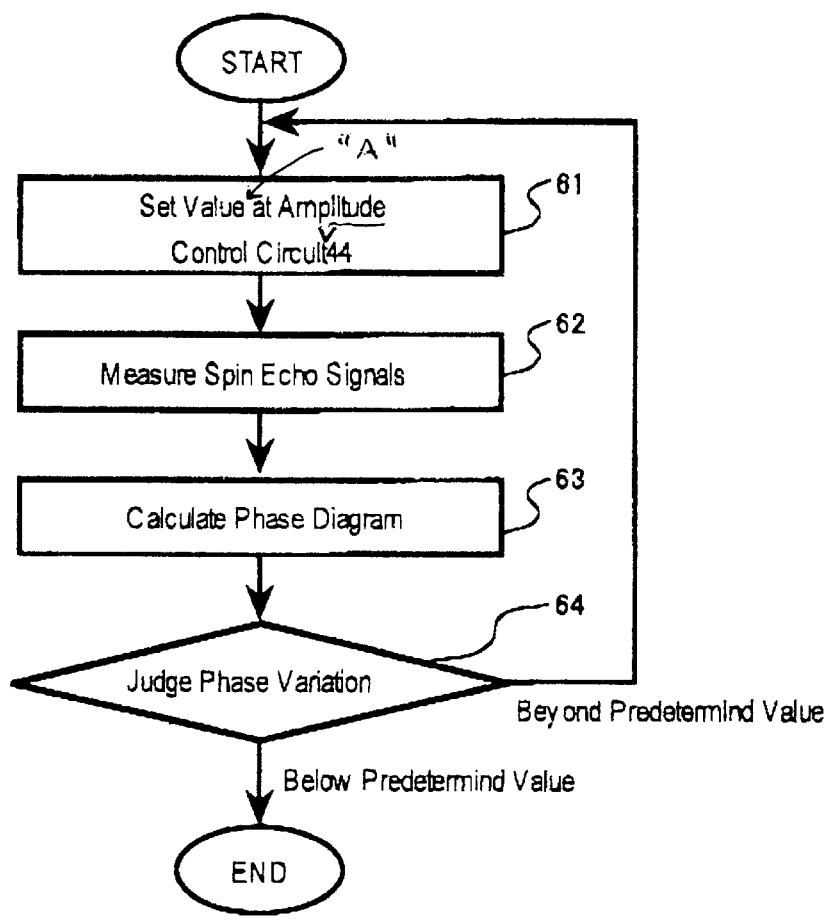
FIG. 6 is a flow diagram showing an embodiment of a method of regulating an amplitude for a correction magnetic field introduced according to the present invention.

As shown in FIG. 6 flow chart, a value A as an initial value is at first set in the amplitude control circuit 44 (step 61). As the value A can be, for example, determined empirically through measurement by making use of a phantom as referred to above. The correction magnetic field generation power source 13 supplies a current corresponding to the set value "A" in the amplitude control circuit 44 from the constant current circuit 45 to the correction magnetic field coils 14. Under this condition an image pickup sequence for adjustment is started. It is preferable that such sequence is hard to be affected by non-uniformity of the static magnetic field, for example, a spin-echo type sequence as shown in FIG. 7 can be used.

Namely, under a condition in which a slice gradient magnetic field 71 is applied, a π/2 high frequency magnetic field pulse 72 is applied to the body 1 to be inspected. Thereby, a nuclear spin in a specific portion (usually a portion corresponding to the center of the magnet) of the body 1 to be inspected is excited. At a time point after passing time τ, under a condition in which another slice gradient magnetic field 73 is applied at a π high frequency magnetic field pulse 74 is applied to the body 1 to be inspected. Thereby, the nuclear spin previously excited is inverted and thus at a time point after passing another time τ a spin echo signal 75 is detected. The detection of the signal is recorded in the CPU 10, for example, as sampling data of 256 points. After passing a repeating time TR spin echo signals 76 are detected in a like manner (step 62).

Figure 7:
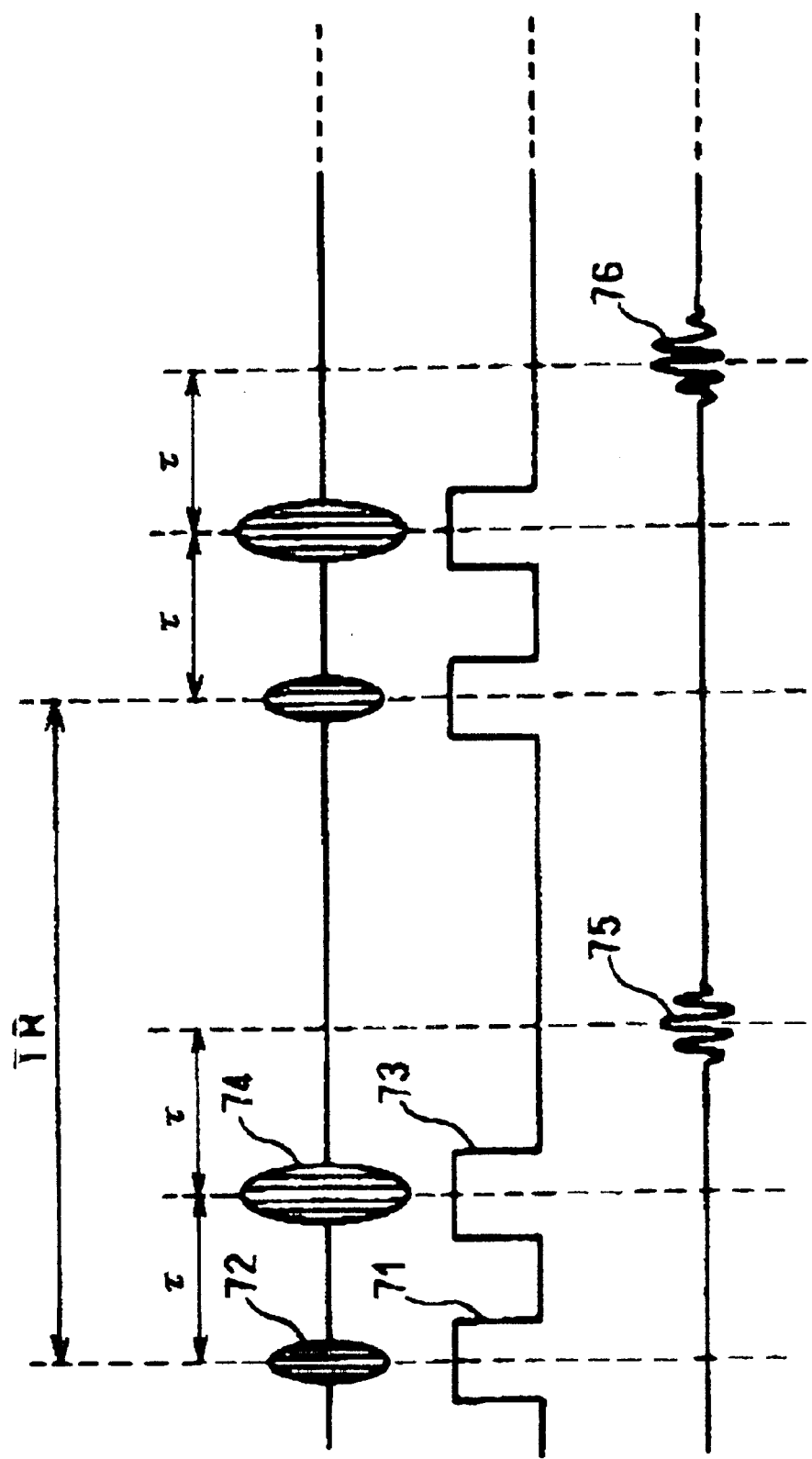
FIG. 7 is a diagram showing an example of pulse sequence used for automatically regulating an amplitude for a correction magnetic field introduced according to the present invention.
Figure 8A:
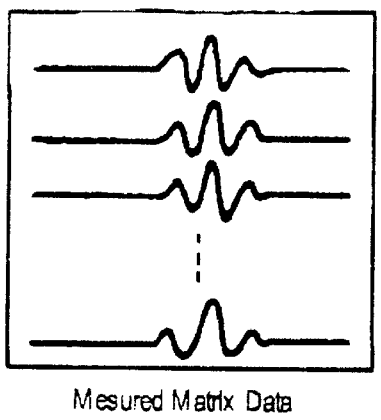
FIGS. 8A and 8B are diagrams for explaining the automatic regulation of the amplitude for a correction magnetic field based on matrix data obtained by making use of the pulse sequence as shown in FIG. 7.

For example, when repeating the measurement as shown in FIG. 7 256 times, 256×256 matrix data as shown in FIG. 8A are recorded in the CPU 10. When subjecting these data to such as Fourier transformation, a phase matrix diagram as shown in FIG. 8B is obtained (step 63).

Figure 8B:
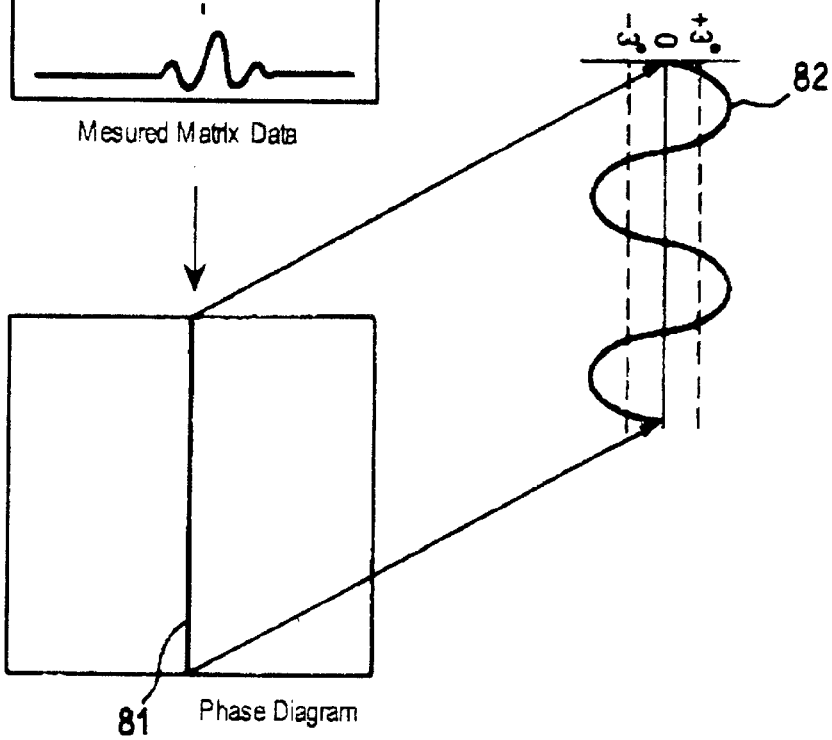

When variation of the static magnetic field intensity is absolutely zero, signals having definitely the same value are obtained for all of the spin echo signals 75, 76, •••, thus all of phase values 82 on a center line 81 in FIG. 8B phase matrix diagram give a same value. However, when there is a magnetic field variation, the phase values also vary. When the variation is periodic, the phase values vary periodically as illustrated in FIG. 8B by enlargement.

The CPU 10 calculates deviation (variation amount) of respective phase values from an average value for all of the signals and judges whether the variation amount is below a predetermined value (step 64). The predetermined value is determined in a range where pseudo images cause no problem for picture image reconstruction, for example, determined at ±3°.

When it is judged that the variation amount of the phase value 82 is below ±3°, the adjustment by the amplitude control circuit 44 is ended. On the other hand, when the variation amount of the phase values 82 is beyond ±3°, the process returns to step 61 and readjustment is performed after modifying the set value of the amplitude control circuit 44 to "A+ΔA". Through repeating these fine adjustment, the variation amount of the phase values can be finally converged within ±3°. Usually, the relationship between the phase value and the adjustment value "A" in the amplitude control circuit 44 is investigated beforehand, the phase value variation can mostly be converged within ±3° with adjustment of two times.

Since the above adjustment sequence can be incorporated in the CPU 10 in a form of program, the amplitude of the correction magnetic field can be adjusted automatically and precisely during actual inspections.

Hereinabove, an MRI apparatus provided with a magnetic field correction system which corrects a periodic vibration has been explained.

According to the present embodiments, the correction magnetic field is accurately synchronized with the periodic vibration due to the helium refrigerator without being affected by the vibrations of the gradient magnetic field and the high frequency magnetic field generated in association with the inspections. Further, since the operation of the correction magnetic field power source 13 is controlled by the control signals from the CPU 10 via the sequencer 9, the correction magnetic field can be generated only during MRI inspections. Still further, these adjustments can be performed automatically with the CPU 10, a stable inspection magnetic field can be always be provided.

Although, in the above embodiments, the periodic vibration of the helium refrigerator caused by the compressor is exemplified, the MRI apparatus according to the present invention is effective not only for the periodic vibration caused by the above referred to devices by themselves but also effective for vibrations causing magnetic field variation in the static magnetic field for the MRI apparatus among other vibrations caused by other devices placed in the building where the MRI apparatus is installed.

Further, the present invention is not limited to the MRI apparatus in which the pair of static magnetic field generation magnets are disposed in vertical direction, but can be applied, for example, to an MRI apparatus in which a pair of static magnetic field generation magnets are disposed in right and left direction with respect to body axis of the body to be inspected.

According to the present invention, an MRI apparatus which uses open type magnet generating a high intensity magnetic field can generate a stable magnetic field without being affected by mechanical vibration in a space where a person to be inspected is positioned. Thereby, an inspection result with a high accuracy can be obtained.

Further, according to the present invention, no measures for detecting vibration and magnetic field variation caused thereby are necessitated, and the correction of the magnetic field variation can be performed without being affected by detection errors possibly caused by such measures.

What is claimed is:

1. A magnetic resonance imaging apparatus comprising:
   a static magnetic field generating means for generating magnetic field of a predetermined intensity, said static magnetic field generating means includes a pair of super conducting coils and a pair of cryostats each accommodating one of said pair of super conducting coils;
   a gradient magnetic field generating means for generating magnetic field having an intensity gradient;
   means for generating a high frequency magnetic field;
   means for detecting nuclear magnetic resonance signals generated from a body to be inspected;
   means for processing the nuclear magnetic resonance signals and for displaying the processed result; and
   a magnetic field correction means for correcting magnetic field variation due to vibration of the static magnetic field generating means;
   wherein the magnetic field correction means generates a correction magnetic field having a frequency corresponding to the frequency of the vibration of a vibration generation source in the static magnetic field generating means.

2. A magnetic resonance imaging apparatus according to claim 1, wherein the magnetic field correction means includes a magnetic field generation coil for generating the correction magnetic field and a power source for driving the magnetic field generation coil, and the power source is provided with operating signals from the vibration generation source and drives the magnetic field generation coil based on the inputted operating signals.

3. A magnetic resonance imaging apparatus according to claim 2, wherein the vibration generation source includes a refrigerator, and the magnetic field correction means corrects the magnetic field variation caused by the vibration generated by the refrigerator.

4. A magnetic resonance imaging apparatus according to claim 1, wherein the static magnetic field generation means further includes a refrigerator connected to one of the cryostats, and the magnetic field correction means corrects the magnetic field variation caused by the vibration generated by the refrigerator.

5. A magnetic resonance imaging apparatus comprising:
   a pair of super conducting coils disposed in a manner being spaced apart in vertical direction so as to form an inspection space for a person to be inspected, the pair of super conducting coils generate a static magnetic field in the inspection space;
   a pair of upper and lower cryostats each accommodating one of the pair of super conducting coils;
   a coupling duct coupling the pair of upper and lower cryostats;
   a helium refrigerator mounted on the upper cryostat and for reducing evaporation amount of liquid helium contained in the pair of upper and lower cryostats;
   a compressor coupled to the helium refrigerator via a high pressure pipe so as to supply compressed helium gas thereto; and
   a magnetic field correction system which generates a counter magnetic field for canceling out a variation component in the static magnetic field caused by vibration of the helium refrigerator.

6. A magnetic resonance imaging apparatus according to claim 5, wherein the magnetic field correction system includes a magnetic field correction coil which generates the counter magnetic field and a correction magnetic field power source circuit which receives operation signals of the compressor and generates a current amplitude with a predetermined amplitude to be supplied to the magnetic field correction coil in synchronism with the received operation signals but in a phase inverted condition.

7. A magnetic resonance imaging apparatus according to claim 6, wherein the predetermined amplitude of the current to be supplied to the magnetic field correction coil is modified according to a phase diagram determined based on spin echo signals measured prior to every inspection.

8. MRI system comprising:
   sources of a main magnetic field, gradient magnetic fields, and a correcting magnetic field acting on a patient being examined;
   auxiliary equipment spaced from the source of the main magnetic field but causing mechanical vibration of said source of the main magnetic field;
   a correction circuit coupled with the auxiliary equipment and to the source of a correcting magnetic field;

said correction circuit causing said source of a correcting magnetic field to counteract effects of said mechanical vibration on at least said main magnetic field.

9. An MRI system as in claim 8, in which said correction circuit comprises a driver imparting to said correcting magnetic field a frequency related to a frequency of said mechanical vibration.

10. An MRI method as in claim 9, in which said correcting magnetic field is at a frequency related to a frequency of said mechanical vibration.

11. An MRI method comprising:
subjecting a patient being examined to a main magnetic field and gradient magnetic fields;
subjecting a source of said main magnetic field to mechanical vibration caused by a vibration source that is spaced from said source of said main magnetic field;
providing a correcting magnetic field acting on the patient to counteract effects of said mechanical vibration on at least said main magnetic field.

12. A magnetic resonance imaging apparatus comprising:
a pair of super conducting coils spaced apart to form an inspection space for an object to be inspected, the pair of super conducting coils generating a static magnetic field in the inspection space;
a pair of cryostats each accommodating one of the pair of super conducting coils;
a gradient magnetic field generation means for generating a magnetic field having an intensity gradient, means for generating a high frequency magnetic field; means for detecting nuclear magnetic resonance signals generated from said object;
means for processing the nuclear magnetic resonance signals and for displaying the processed result;
a helium refrigerator system mounted on one of said cryostats; and
a magnetic field correction system for generating a magnetic field to cancel out a variation component in the static magnetic field caused by vibration of the helium refrigerator system.

13. A magnetic resonance imaging apparatus according to claim 12, wherein said magnetic field correction system comprises a magnetic field correction coil for generation a correction magnetic field in said inspection space, and wherein said power source receives operating signals from said helium refrigerator system and drives said magnetic field generation coil based on said operating signals.

14. A magnetic resonance imaging apparatus according to claim 12, wherein said pair of cryostats comprise an upper cryostat and a lower cryostat.

15. A magnetic resonance imaging apparatus according to claim 12, further comprising a coupling duct for coupling the pair of cryostats.

16. A magnetic resonance imaging apparatus according to claim 12, wherein said helium refrigerator system includes a compressor, and said magnetic field correction system generates a counter magnetic field based on operation signals from said compressor for canceling out a variation components in the static magnetic field.

17. A magnetic resonance imaging apparatus comprising:
a pair of super conducting coils spaced apart to form an inspection space for an object to be inspected, the pair of super conducting coils generating a static magnetic field in the inspection space;
a pair of cryostats each accommodating one of the pair of super conducting coils;
a gradient magnetic field generation means for generating a magnetic field having an intensity gradient,
means for generating a high frequency magnetic field;
means for detecting nuclear magnetic resonance signals generated from said object;
means for processing the nuclear magnetic resonance signals and for displaying the processed result;
a helium refrigerator system having a compressor for compressing helium gas and mounted on one of said cryostats, said compressor generating operation signals;
a magnetic field correction coil system for generating a magnetic field to cancel out a variation component in the static magnetic field caused by vibration of said compressor; and
a magnetic field correction circuit for generating a current to be supplied to said magnetic field correction coil based on said operation signals from said compressor.

18. An open type magnetic resonance imaging apparatus comprising:
a magnet assembly including an upper superconducting coil and a lower superconducting coil separated by an open space for a patient that is free of a housing forming a tunnel around a patient in said open space;
said magnet assembly producing a static magnetic field in said open space;
an active source of mechanical vibration that is spaced from said magnet assembly but causes mechanical vibration thereof that in turn causes variations in said static magnetic field;
a source of operation signals related to the vibration of said active source; and
a correction coil driven according to said operation signals to cancel or reduce said variations of the static magnetic field.

* * * * *